(12) United States Patent
Koh

(10) Patent No.: US 7,205,193 B2
(45) Date of Patent: Apr. 17, 2007

(54) SEMICONDUCTOR DEVICE AND METHOD FOR FABRICATING THE SAME

(75) Inventor: Kwan Joo Koh, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/024,733

(22) Filed: Dec. 30, 2004

(65) Prior Publication Data

US 2005/0139890 A1 Jun. 30, 2005

(30) Foreign Application Priority Data

Dec. 30, 2003 (KR) ............... 10-2003-0100708
Dec. 30, 2003 (KR) ............... 10-2003-0100955

(51) Int. Cl.
*H01L 21/8242* (2006.01)
*H01L 27/108* (2006.01)

(52) U.S. Cl. ............... 438/243; 438/245; 438/248; 438/388; 257/301; 257/300

(58) Field of Classification Search ........ 438/243–245, 438/248, 385–388; 257/300, 301, 296, 306
See application file for complete search history.

(56) References Cited

U.S. PATENT DOCUMENTS

| 6,204,527 B1* | 3/2001 | Sudo et al. ............... 257/301 |
| 2001/0053577 A1* | 12/2001 | Forbes et al. ............... 438/242 |
| 2004/0106254 A1* | 6/2004 | Furuhata et al. ............ 438/243 |

* cited by examiner

*Primary Examiner*—Hsien-Ming Lee
(74) *Attorney, Agent, or Firm*—Lowe Hauptman & Berner, LLP

(57) ABSTRACT

A semiconductor device and method for fabricating the same. The semiconductor device including a first conductive type semiconductor substrate having an active region and a field region defined thereon, and a trench formed in the field region. The semiconductor device also includes a storage dielectric film on an inside surface of the trench, a storage electrode of a capacitor in the trench having the dielectric film formed therein, and an active cell isolation film in the trench on the storage electrode. The semiconductor device further includes a transistor on the semiconductor substrate in the active region, the transistor having gate and a source and/or drain region formed such that the source and/or drain region is electrically connected to the storage electrode.

9 Claims, 16 Drawing Sheets

SEMICONDUCTOR DEVICE AND METHOD FOR FABRICATING THE SAME

BACKGROUND OF THE INVENTION

1. Field of the Invention

The present invention relates to semiconductor devices, and more particularly, to a semiconductor device and a method for fabricating the same.

2. Discussion of the Related Art

Recently, as high density semiconductor device packing progresses rapidly, various geometrical structures of the semiconductor device have also been drastically changed.

FIG. 1 illustrates a section of a related art memory having cells each with a transistor and a capacitor.

Referring to FIG. 1, a semiconductor device is provided with a semiconductor substrate 1 having a field region FR and an active region AR defined by an active cell isolation film 2. In the active region AR of the semiconductor substrate 1, there are a transistor 10 for selective switching of a charge flow and a capacitor 20 for storage of charges switched by the transistor 10, both of which are arranged related to each other.

The transistor 10 has a gate insulating film pattern 11, a gate electrode pattern 12, spacers 13, and source/drain diffusion layers 14, and the storage capacitor 20 has a storage dielectric film 21 and a storage electrode 22.

The storage dielectric film 21 and the storage electrode 22 of the capacitor 20 are formed in a trench in the semiconductor substrate 1, with a portion 22a of the storage electrode 22 exposed from a surface of the semiconductor substrate 1, so as to be in electrical contact with the source/drain diffusion layer 14.

However, the related art semiconductor device has the following problems. Although a device packing density has been enhanced by forming the capacitor in the trench of the semiconductor substrate in the active region AR, because the trench is formed in the active region, the capacitor is formed within an area of the active region AR of the semiconductor device. This imposes a limit on increasing the capacitance of the capacitor. Moreover, since there is a limit on the reduction of the active region AR of the semiconductor device, there is a limit on the fabrication of a high density semiconductor device package.

Of course, if a structure of the capacitor is changed from above trench structure to a stack type structure in which elements are stacked on the semiconductor substrate 1 (on the transistor), the problem of size increase of the active region AR can be reduced to a certain extent. However, a serious problem occurs in that an overall step height of the semiconductor device unnecessarily increases as much as the stacking height of the capacitor.

SUMMARY OF THE INVENTION

Accordingly, the present invention is directed to a semiconductor device and a method for fabricating the same that substantially obviates one or more problems due to limitations and disadvantages of the related art.

The present invention advantageously provides a semiconductor device and a method for fabricating the same in which a capacitor is formed in an active cell isolation trench in a field region.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a semiconductor device includes a first conductive type semiconductor substrate having an active region and a field region defined thereon, and a trench formed in the field region, a storage dielectric film on an inside surface of the trench, a storage electrode of a capacitor in the trench having the dielectric film formed therein, an active cell isolation film in the trench on the storage electrode, and a transistor on the semiconductor substrate in the active region, the transistor having gate and a source and/or drain regions formed such that the source and/or drain region is electrically connected to the storage electrode.

The storage electrode includes a first storage electrode in the trench having the dielectric film formed therein, and a second storage electrode for electrically connecting the source and/or drain region of the transistor and the first storage electrode.

The semiconductor device further includes a second conductive type well in the semiconductor substrate in the active region.

The semiconductor substrate is a Silicon On Insulator substrate having a buried oxide film.

In another aspect of the present invention, a semiconductor device includes a first conductive type semiconductor substrate having an active region and a field region defined thereon, and a trench formed in the field region, a storage dielectric film on an inside surface of the trench, a first storage electrode of a capacitor in the trench having the dielectric film formed therein, a protective film on the first storage electrode, a second conductive type epitaxial layer on an entire surface of the first conductive type semiconductor substrate, an active cell isolation film in the field region of the second conductive type epitaxial layer, a transistor on the second conductive type epitaxial layer in the active region, an open trench formed by selectively removing the second conductive type epitaxial layer adjacent to the active cell isolation film and the protective film, and a second storage electrode in the open trench to connect the source and/or drain region of the transistor and the first storage electrode.

In another aspect of the present invention, a method for fabricating a semiconductor device includes the steps of forming a trench in a field region of a first conductive type semiconductor substrate, the first conductive type semiconductor substrate having an active region and the field region defined thereon, forming a storage dielectric film on an inside wall of the trench, forming a storage electrode in the trench, forming an active cell isolation film in the trench on the storage electrode, and forming a transistor on the semiconductor substrate in the active region, the transistor formed to have a gate and a source and/or drain region such that the source and/or drain region is electrically connected to the storage electrode.

In further aspect of the present invention, a method for fabricating a semiconductor device includes the steps of forming a trench in a field region of a first conductive type semiconductor substrate, the first conductive type semiconductor substrate having an active region and the field region defined thereon, forming a storage dielectric film on an inside surface of the trench, forming a first storage electrode in the trench, forming a protective film on the first storage electrode, forming a second conductive type epitaxial layer on an entire surface of the first conductive type semiconductor substrate, forming an active cell isolation trench in the field region of the second conductive type epitaxial layer, forming an active cell isolation film in the active cell isolation trench, forming an open trench in the second conductive type epitaxial layer adjacent to the active cell isolation film to expose the first storage electrode, forming a second storage electrode in the open trench, the second storage electrode connected to the first storage electrode, and forming a transistor on the second conductive type epitaxial layer in the active region such that the source and/or drain region is connected to the second storage electrode.

It is to be understood that both the foregoing general description and the following detailed description of the present invention are exemplary, but are not restrictive of the invention.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to exemplary embodiments of the present invention, which are illustrated in the accompanying drawings. Wherever possible, the same reference numbers will be used throughout the drawings to refer to the same or like parts.

First Embodiment

Figure 1:
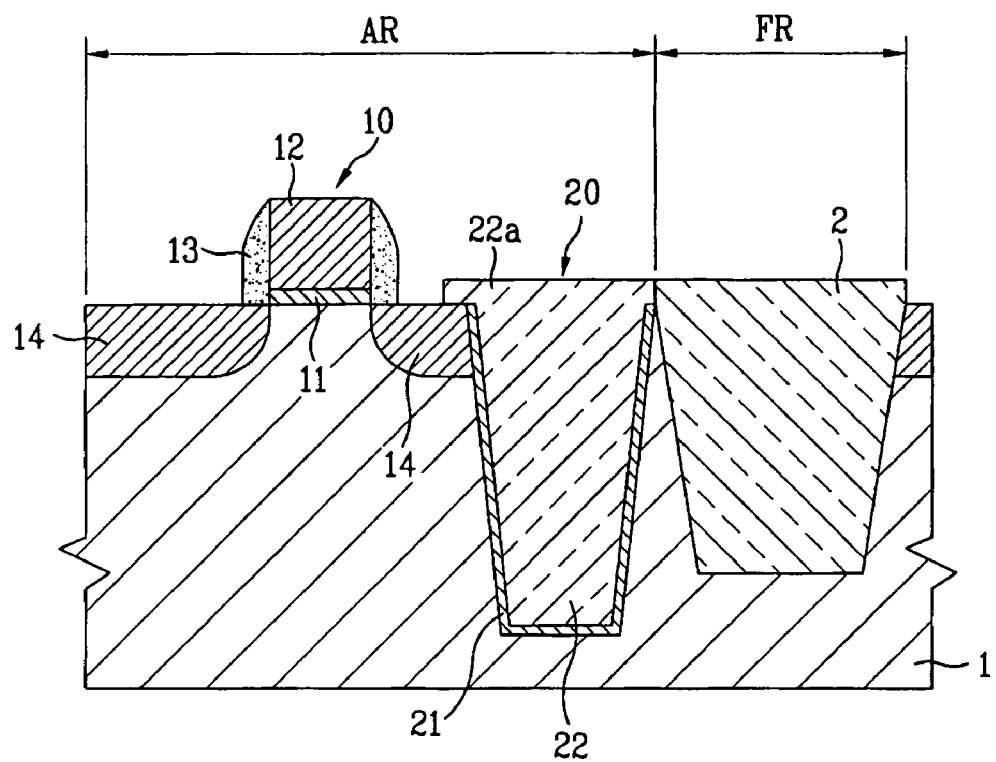
FIG. 1 illustrates a section of a related art memory having cells each with a transistor and a capacitor.
Figure 2:
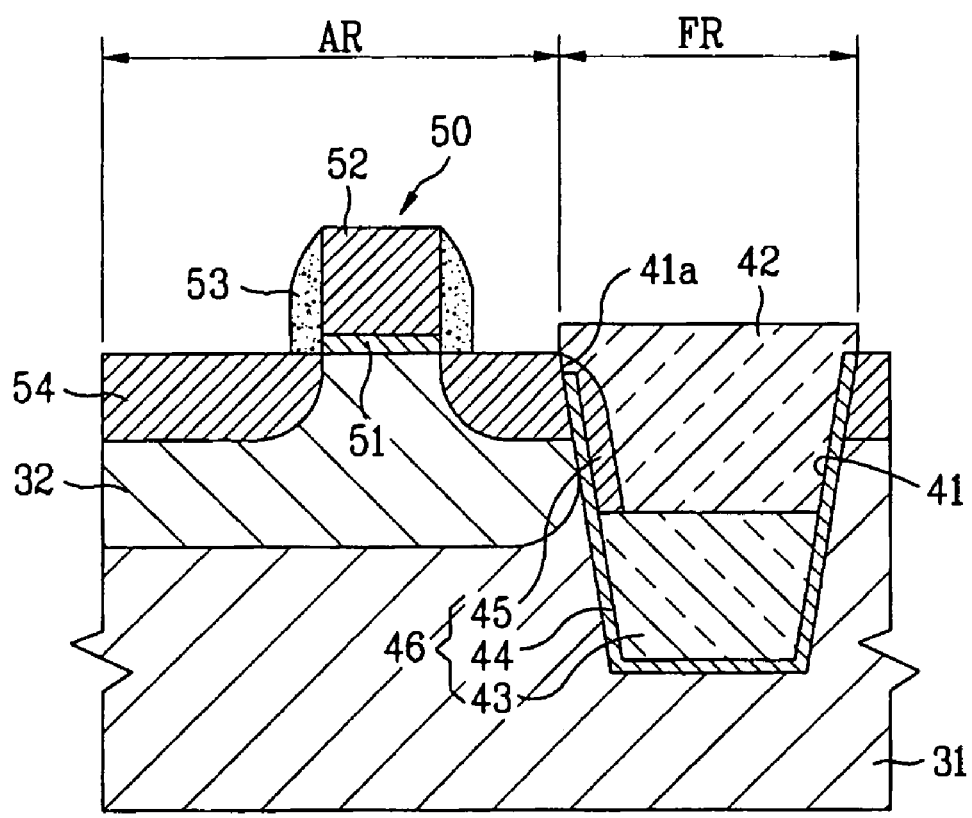
FIG. 2 illustrates a section of a semiconductor device in accordance with a first embodiment of the present invention.

FIG. 2 illustrates a section of a semiconductor device in accordance with a first exemplary embodiment of the present invention, having cells each with a transistor and a capacitor.

Referring to FIG. 2, the semiconductor device includes a first conductive type (for an example, an n type) semiconductor substrate 31 having a field region FR and an active region AR defined by an active cell isolation film 42. In the active region AR of the semiconductor substrate 31, there is a transistor 50 for selective switching of a charge flow. There is a capacitor 46 formed in the semiconductor substrate at a lower portion of the active cell isolation film 42 in the field region FR of the semiconductor substrate 31. There is a second conductive type (for an example, a p type) well 32 formed in the semiconductor substrate 31 under the transistor 50.

The transistor 50 includes a gate insulating film pattern 51 and a gate electrode pattern 52 on the second conductive type well 32 in the first conductive type semiconductor substrate 31, spacers 53 at sides of the gate electrode pattern 52, and first conductive type (for example, an n type) source/drain diffusion layers 54 in the second conductive type well 32 on opposite sides of the gate electrode pattern 52.

The capacitor 46 includes a trench 41 in the semiconductor substrate 31, a storage dielectric film 44 on an inside surface 41a of the trench 41, a first storage electrode 43, and a second storage electrode 45 filled in a portion of a space of the trench 41 so as to be connected to the source/drain diffusion layer 54 of the transistor 50. In this instance, the active cell isolation film 42 is in the rest of the trench 41 at the upper portion of the capacitor 46.

The first storage electrode 43 is surrounded by the storage dielectric film 44 in the trench 41. A second storage electrode 45 on an inside surface 41a of the trench 41 is supported on the first storage electrode 43. The second storage electrode 45 is electrically connected to the source/drain diffusion layer 54 of the transistor 50 and the first storage electrode 43. The second storage electrode 45 is electrically isolated from the substrate by the storage dielectric film 44.

Since the capacitor 46 is on a lower side of the active cell isolation film, a required area of the active region AR of the semiconductor substrate 31 can be substantially reduced in proportion to an area of the capacitor. That is, because the related art trench type capacitor occupies a portion of the active region, the required area of the active region of the semiconductor device must increase as much as the area occupied by the capacitor. Since the present invention can reduce the active region of the semiconductor device, fabrication of a high density device package is possible. Moreover, the trench type capacitor avoids a step height increase while a size of the active region AR is maintained to a minimum.

A method for fabricating a semiconductor device in accordance with a first embodiment of the present invention will be described. FIGS. 3A–3L illustrate sections showing the steps of a method for fabricating a semiconductor device in accordance with a first embodiment of the present invention.

Figure 3A:
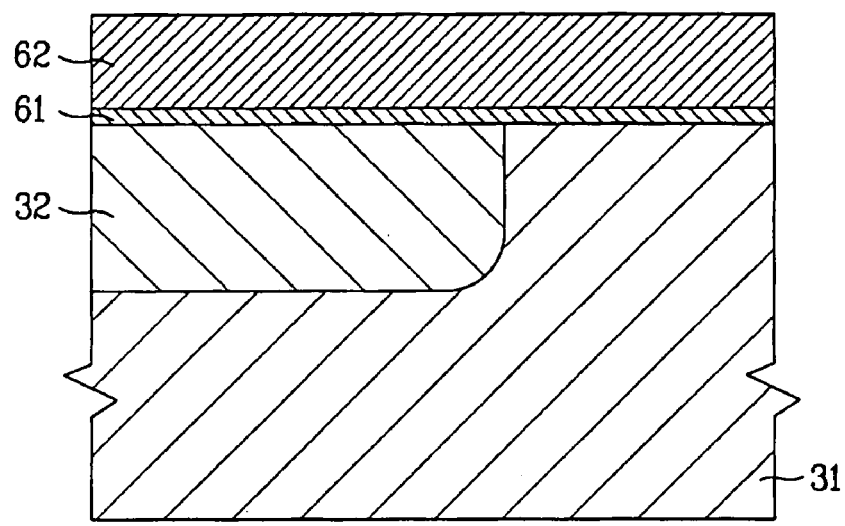
FIGS. 3A–3L illustrate sections showing the steps of a method for fabricating a semiconductor device in accordance with a first embodiment of the present invention.

Referring to FIG. 3A, second conductive type impurity ions are selectively injected into a first conductive type semiconductor substrate 31 at a transistor region. The ions are diffused to form a second conductive type well 32. A high temperature thermal oxidation process is performed to grow a sacrificial oxide film 61 on an entire surface of the first conductive type semiconductor substrate 31 of, for example single crystal silicon, to a thickness in a range of about 120 Å to about 170 Å. The sacrificial oxide film 61 moderates stress to the semiconductor substrate 31 applied from a sacrificial nitride film 62 formed later.

A low pressure chemical vapor deposition process is performed to form the sacrificial nitride film 62 on the sacrificial oxide film 61 to a thickness in a range of about 2000 Å to about 5000 Å. The sacrificial nitride film 62 serves as a mask layer in formation of the trench 41 later, and as an etch stop film during chemical-mechanical polishing.

Figure 3B:
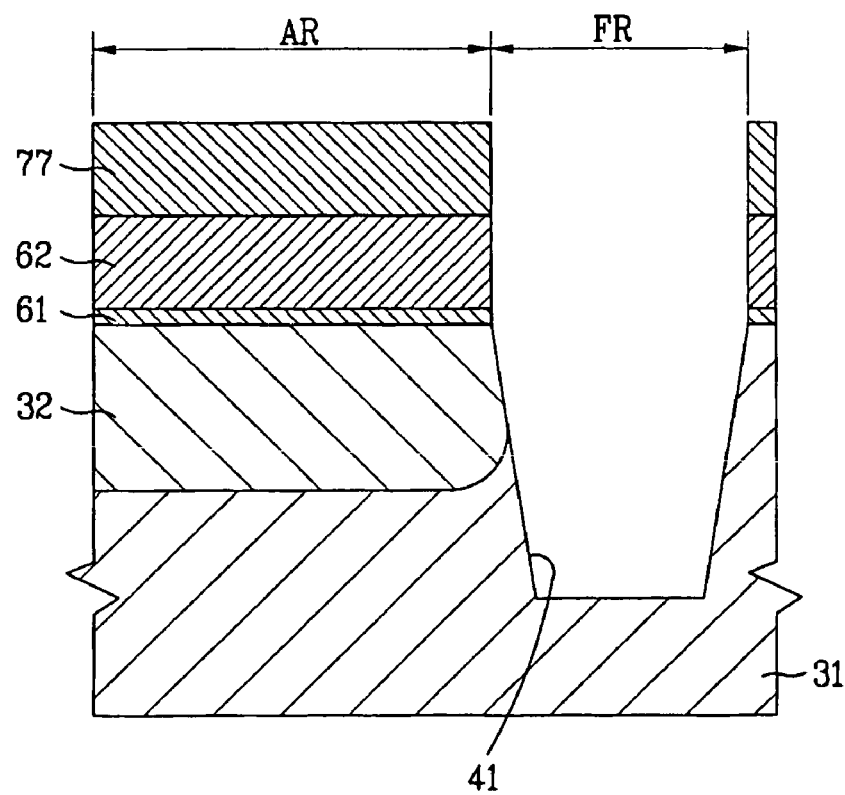

Referring to FIG. 3B, a first photoresist film pattern 77 is formed on the sacrificial nitride film 62 to expose the sacrificial nitride film 62 in the field region FR of the semiconductor substrate 31. A dry etching process (for an example, a reactive ion etching process) having an anisotropic characteristic is performed by using the first photoresist pattern 77 as a mask. The sacrificial oxide film 61 and the sacrificial nitride film 62 are selectively removed to expose the semiconductor substrate 31 in the field region FR. Then, the first photoresist pattern 77 is removed.

A reactive ion etching process is performed by using the remaining sacrificial oxide film 61 and sacrificial nitride film 62 as a mask. The exposed semiconductor substrate 31 is etched in the field region FR anisotropically to a depth in a range of about 6000 Å to about 12000 Å to form an active cell isolation trench 41.

Figure 3C:
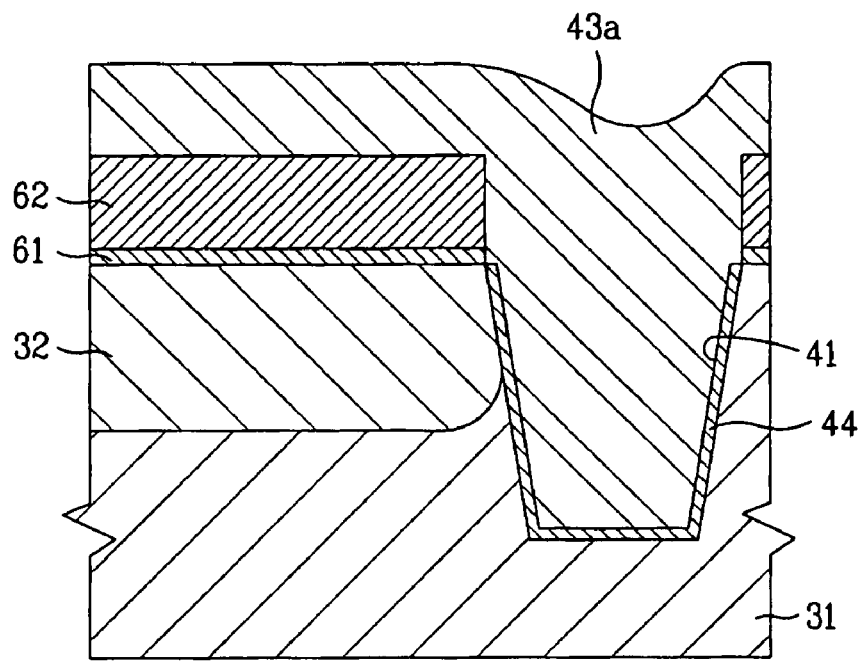

Referring to FIG. 3C, upon finishing formation of the trench 41, a thermal oxidation process is performed at a temperature ranging from about 800° C. to about 900° C. A storage dielectric film 44 is formed on an inside surface 41a of the trench 41 in the semiconductor substrate 31 with a thickness ranging from about 100 Å to about 400 Å.

A chemical vapor deposition process is performed to form a first polysilicon layer 43a on an entire surface of the semiconductor substrate 31 to cover the sacrificial nitride film 62 and substantially fill the trench.

Figure 3D:
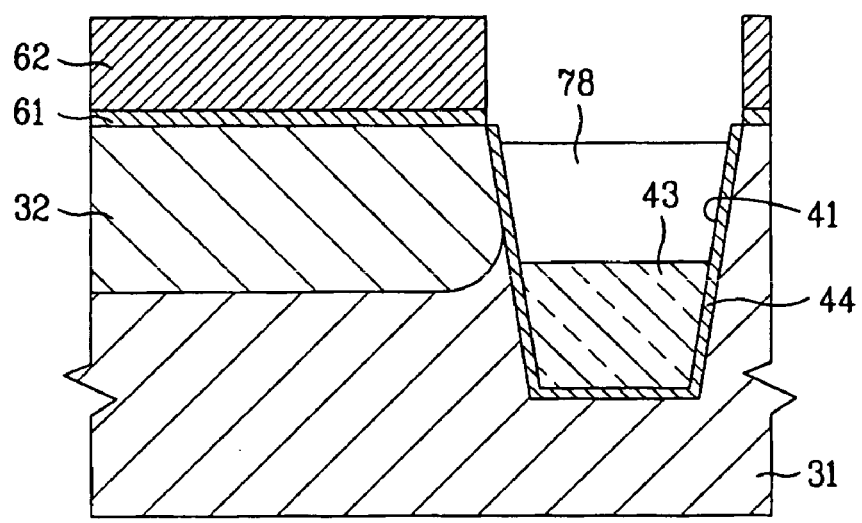

Referring to FIG. 3D, a chemical mechanical polishing process is performed to remove the first polysilicon layer 43a until a surface of the sacrificial nitride film 62 is exposed. The surface is smoothed. The smoothed first polysilicon layer 43a is etched back to form a first storage electrode 43 surrounded by the storage dielectric film 44 and filled in a lower space of the trench 41. The storage electrode 43 has a thickness of about 5000 Å to about 8000 Å.

Figure 3E:
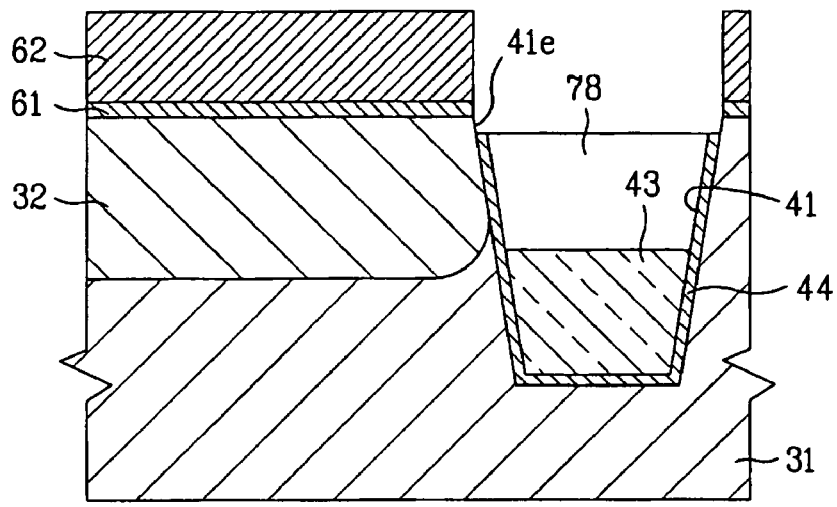

Referring to FIG. 3E, a second photoresist pattern 78 is formed on the first storage electrode in the trench 41. The second photoresist film pattern 78 is formed to expose some of an upper portion of the storage dielectric film 44. Then, wet etching is performed with HF solution to selectively remove the storage dielectric film 44 exposed from the second photoresist film 78. A portion of the inside surface 41a of the trench 41 is exposed. The exposed inside surface 41e of the trench 41 is a portion in which a second storage electrode is to be formed. The second storage electrode connects the source/drain active layers of the transistor to be formed later and the first storage electrode 43. Then, the second photoresist film pattern 78 is removed.

Figure 3F:
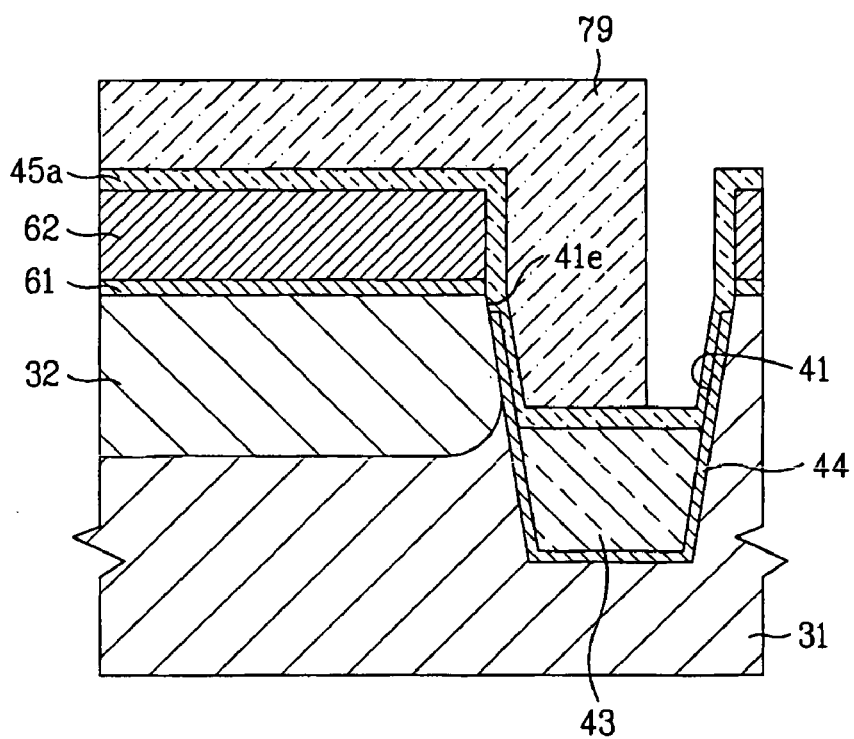

Referring to FIG. 3F, chemical vapor deposition is performed to form a second polysilicon layer 45a on an entire surface of the semiconductor substrate 31 inclusive of the trench 41. A third photoresist film pattern 79 is formed on the second polysilicon layer 45a to cover the active region AR of the semiconductor substrate 31 and a portion of the trench 41 on an active region side.

Figure 3G:
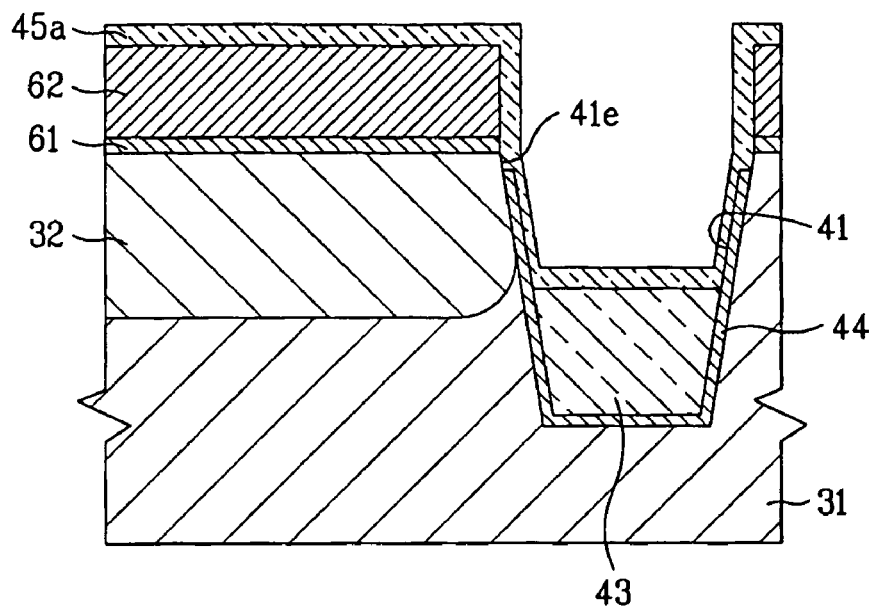

Referring to FIG. 3G, the second polysilicon layer 45a is removed selectively by using the third photoresist film pattern 79 as a mask. The second polysilicon layer 45a is left in the active region AR of the semiconductor substrate 31 and only at a portion of the trench on an active region AR side.

Figure 3H:
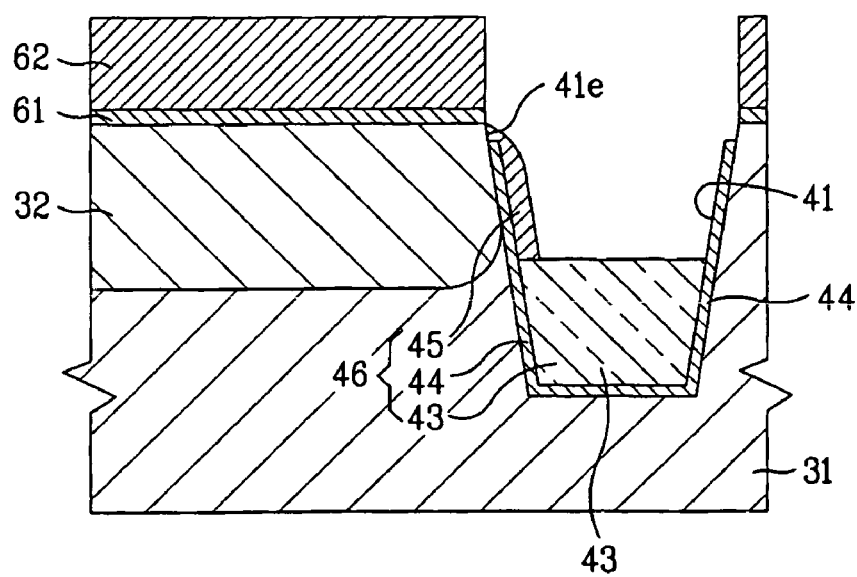

Then, referring to FIG. 3H, an etch back process is performed targeting the second polysilicon layer 45a, to form a second storage electrode 45 on the inside surface 41a of the trench electrically connected to the first storage electrode 43. In this instance, the second storage electrode 45 has a thickness of about 500 Å to about 1000 Å. The second storage electrode 45 is electrically connected to a source/drain diffusion layer 54 of the transistor to be formed later.

Figure 3I:
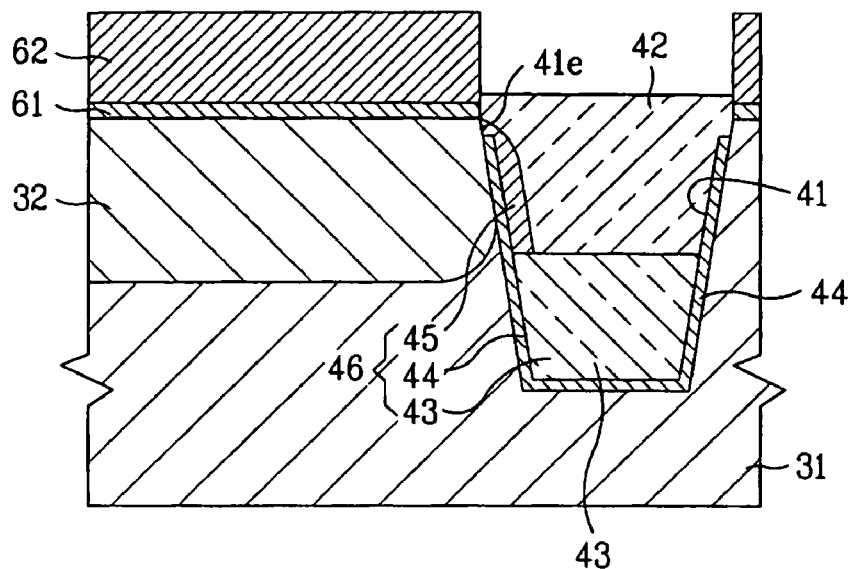

Referring to FIG. 3I, an ozone-TEOS (Tetra Ortho Silicate Glass) process, an atmospheric chemical vapor deposition process, a plasma chemical vapor deposition process, a high density plasma chemical vapor deposition process, or a similar process is performed selectively to form an oxide film on the sacrificial nitride film 62 to substantially fill the trench 41. A chemical mechanical polishing process is performed until a surface of the sacrificial nitride film 62 is exposed. The surface is smoothed. Then, the smooth oxide film is subjected to an anisotropic etching to remove a predetermined thickness to form an active cell isolation film 42 which fills rest of the trench 41.

Figure 3J:
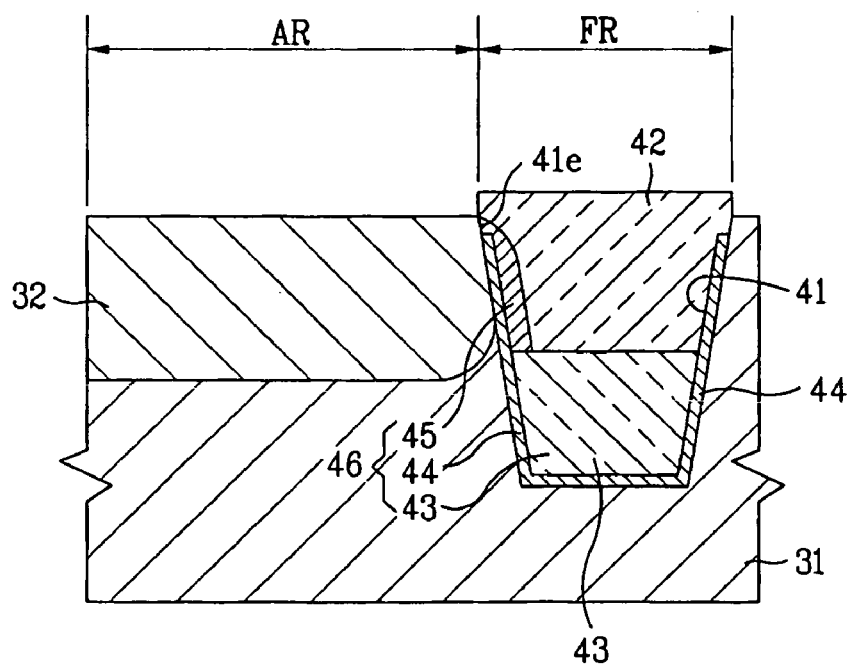

Referring to FIG. 3J, a wet etching process is performed with a phosphoric acid solution to remove the sacrificial nitride film 62 entirely. A wet etching process is performed with a fluoric acid solution to remove the sacrificial oxide film 61 entirely.

Thus, fabrication is completed of a structure including a capacitor 46 filling a portion of an inside space of the trench 41 in the semiconductor substrate 31 and an active cell isolation film 42 filling rest of the trench for isolating active cells.

Figure 3K:
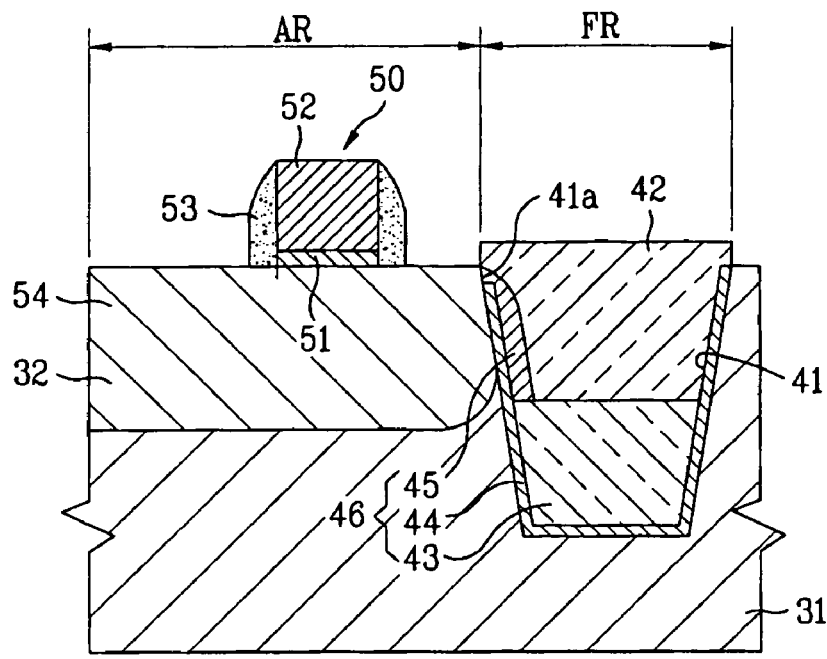

Referring to FIG. 3K, a thermal oxidation process is performed to form a gate insulating film on the first conductive type semiconductor substrate 31 in the active region AR. A chemical vapor deposition process is performed to form a conductive layer for forming a gate electrode on the gate insulating film. A photoetching process is performed to pattern the gate insulating film and the conductive layer. A gate insulating film pattern 51 and a gate electrode pattern 52 are formed on the second conductive type well 32. A series of chemical vapor deposition processes are performed to form an oxide film and a nitride film on an entire surface of the semiconductor substrate inclusive of the gate electrode pattern 52 in succession. A dry etching process or a reactive ion etching process, having an anisotropic etching characteristic, is performed to etch the oxide film and the nitride film to form spacers 53 at opposite sidewall of the gate electrode pattern 52.

In this instance, though it is shown in the drawings that only one gate electrode pattern 52 is formed on the semiconductor substrate 31, it is apparent that there is actually a plurality of gate electrode patterns 52 on the semiconductor substrate 31 of the semiconductor device.

Figure 3L:
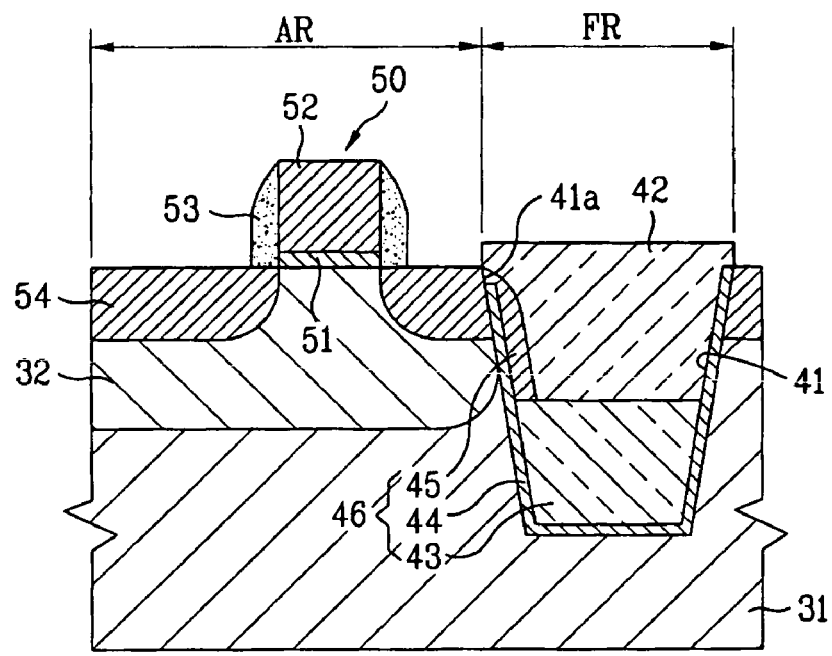

Referring to FIG. 3L, first conductive type (for an example, an n type) impurity ions are injected into the second conductive type well 32 in the semiconductor substrate 31 by using the spacers 53 and the gate electrode pattern 52 as a mask to form source/drain diffusion layer 54 on opposite sides of the gate electrode pattern 52. The source/drain diffusion layer 54 is in electrical contact with the second storage electrode 45 of the capacitor 46 spontaneously through the inside surface 41a of the trench 41. The capacitor 46 stores charges switched by the transistor 50 securely even if the capacitor 46 is in the trench 41 buried under the active cell isolation film 42.

For an example, an interlayer insulating film forming process, a contact hole forming process, a metal wiring process, and so on are performed, to finish fabrication of a semiconductor device. Therefore, the first conductive type semiconductor substrate 31 is used as a common electrode, and the dielectric film 44 and the first storage electrode 43 compose the capacitor.

Second Embodiment

There can be variations of the first embodiment depending on a situation.

Figure 4:
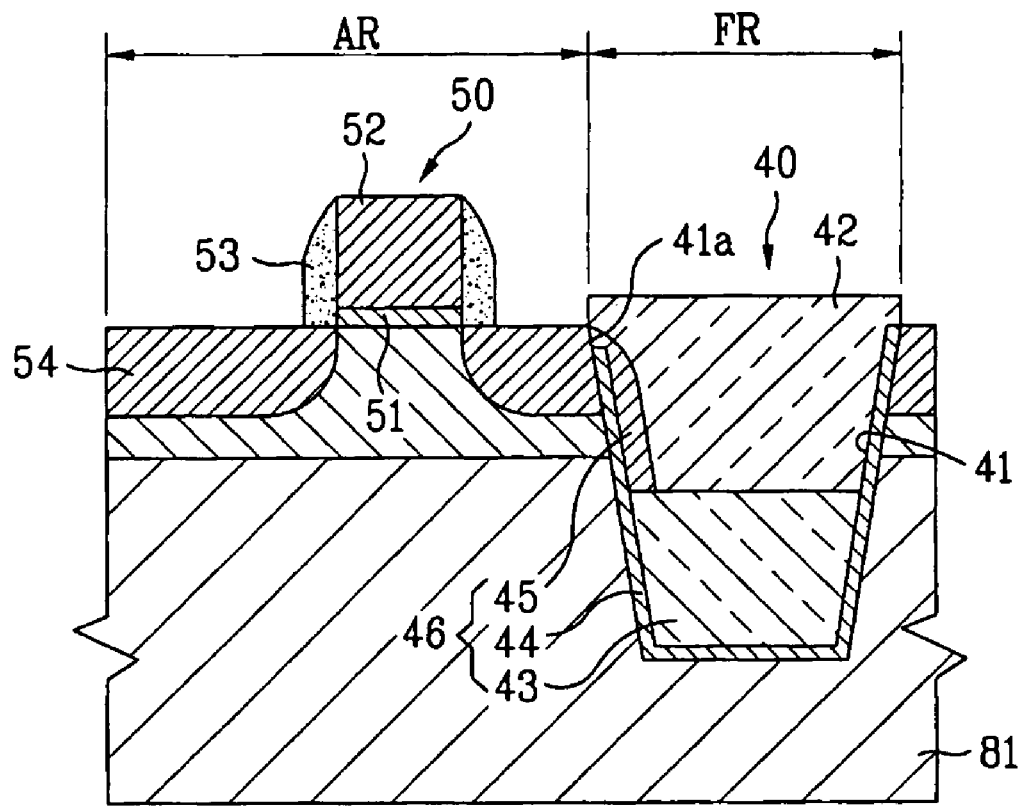
FIG. 4 illustrates a section of a semiconductor device in accordance with a second embodiment of the present invention.

FIG. 4 illustrates a section of a semiconductor device in accordance with a second exemplary embodiment of the present invention.

Referring to FIG. 4, the capacitor under the active cell isolation film 42 may be formed in an SOI substrate (Silicon On Insulator substrate) having a buried oxide film 81. In this case, the completed semiconductor device can achieve improved active cell isolation performance, reduction of parasitic capacitance, and so on, more easily.

Since the capacitor is formed, not in the active region AR of the semiconductor substrate, but in the field region FR of the semiconductor substrate (i.e., in the active cell isolation trench 41), an area of the active region AR of the semiconductor device is reduced to a minimum. The completed semiconductor device can meet the requirement for the high density device packing with flexibility. Other aspects of the second embodiment are similar to the corresponding aspects of the first embodiment.

Third Embodiment

A trench type capacitor may be formed in a first conductive type semiconductor substrate, and by epitaxial growth, or single crystal layer deposition, a second conductive type epitaxial layer may be formed on the first conductive semiconductor substrate to form a transistor. This third embodiment of the present invention will be described with reference to the attached drawings.

Figure 5:
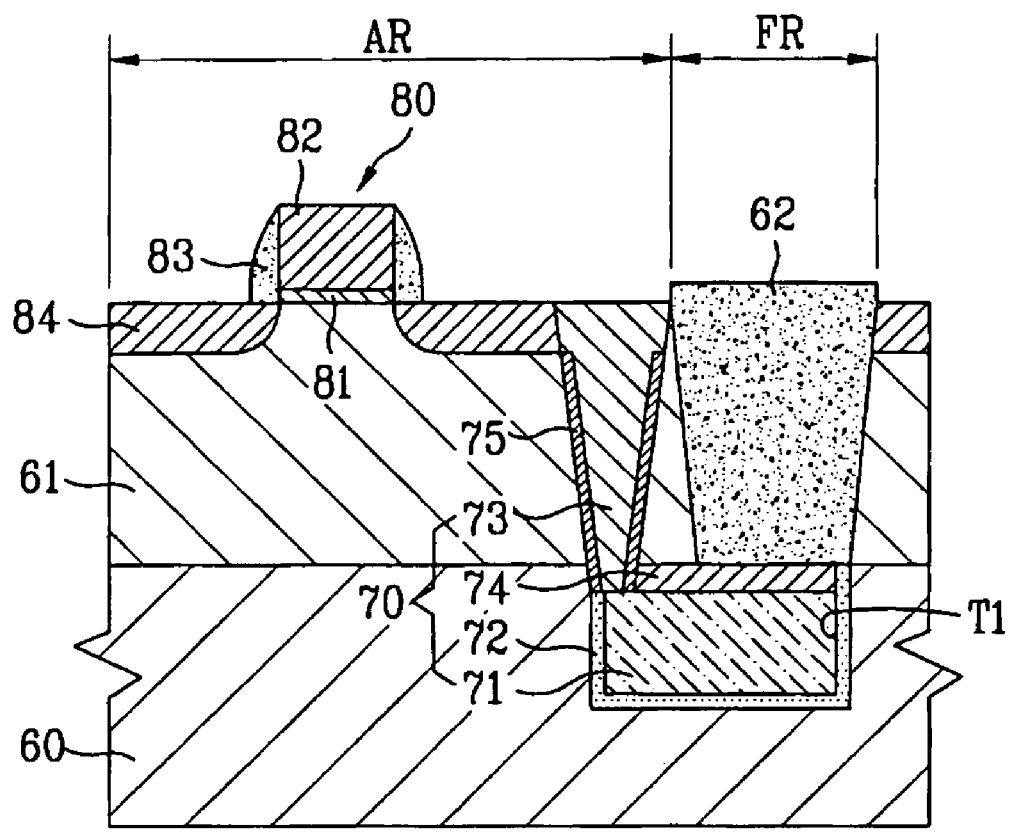
FIG. 5 illustrates a section of a semiconductor device in accordance with a third embodiment of the present invention.

FIG. 5 illustrates a section of a semiconductor device in accordance with a third exemplary embodiment of the present invention. FIGS. 6A–6K illustrate sections showing the steps of a method for fabricating a semiconductor device in accordance with a third exemplary embodiment of the present invention.

Referring to FIG. 5, the semiconductor device includes a first conductive type (for an example, an n type) semiconductor substrate 60 having a field region FR and an active region AR defined thereon. There is a trench T1 in the field region FR. Formed in the trench T1 in the first conductive type semiconductor substrate 60, there is a capacitor 70. A second conductive type (for an example, a p type) epitaxial layer 61 is formed on an entire surface of the first conductive type semiconductor substrate 60 inclusive of the capacitor.

In the active region AR of the second conductive type epitaxial layer 61 there is a transistor 80 for switching a charge flow selectively. In the field region FR of the second conductive type epitaxial layer 61 there is a second storage electrode 73 for connecting the active cell isolation film 62, the source/drain diffusion layer of the transistor 80, and the capacitor 70.

The transistor 80 includes a gate insulating film pattern 81 and a gate electrode pattern 82 on the second conductive type epitaxial layer 61 in the active region AR, spacers 83 at sides of the gate electrode pattern 82, and first conductive type (for an example, an n type) source/drain diffusion layer in the second conductive type epitaxial layer on opposite sides of the gate electrode pattern 82.

The capacitor 70 includes a dielectric storage film 72 on an inside surface of the trench T1, and a first storage electrode 71 in the trench T1 having the storage dielectric film 72 formed thereon.

The second storage electrode 73 electrically connects the first storage electrode 71 of the capacitor 70 to the source/drain diffusion layer 84 of the transistor 80. The second storage electrode 73 is electrically isolated from the second conductive epitaxial layer 61 by the insulating film 75. On a surface of the first storage electrode 71, there is a passivation film 74 of nitride formed additionally for preventing damage to the first storage electrode 71.

Since the capacitor 70 is formed in the field region and first conductive type semiconductor substrate 60 is used as a common electrode of the capacitor 70, a requirement for an area of the active region AR of the semiconductor substrate 60 can be substantially reduced by an area of the capacitor. That is, because the trench type capacitor in the related art occupies a portion of the active region, a required area of the active region of the semiconductor device must increase significantly as much as the occupied area of the capacitor if no other measure is taken. Since the present invention can reduce the active region of the semiconductor device, fabrication of a high density device package is possible. Moreover, the trench type capacitor avoids damage caused by step height increases, while maintaining an area of the active region AR to a minimum.

A method for fabricating the foregoing semiconductor device will be described in detail.

Figure 6A:
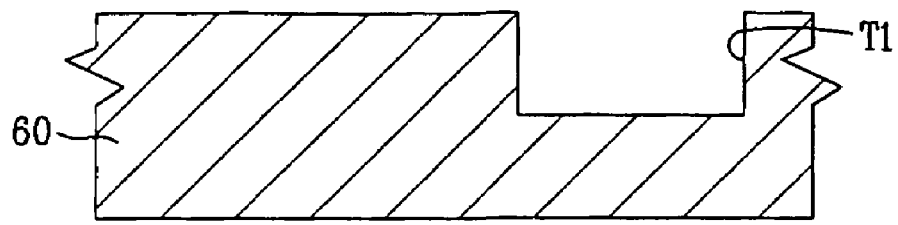
FIGS. 6A–6K illustrate sections showing the steps of a method for fabricating a semiconductor device in accordance with a third embodiment of the present invention.

Referring to FIG. 6A, a first conductive type semiconductor substrate 60, such as single crystal silicon, or so on, is etched selectively, to form a trench T1 in a field region. The trench T1 has adequate size and depth so that a storage dielectric film and a storage electrode to be formed later have good charge storage capability.

Figure 6B:
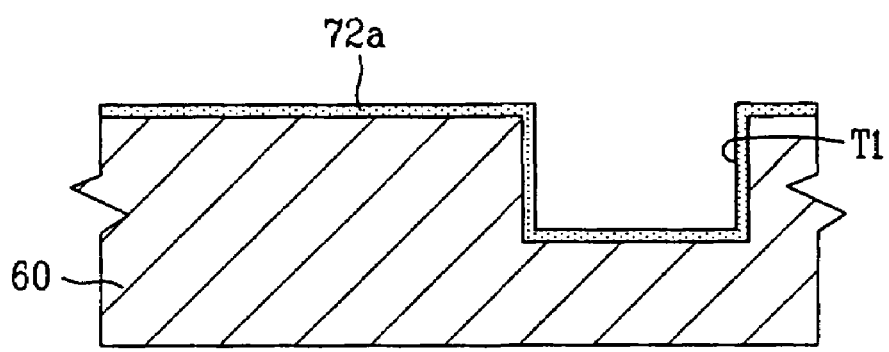

Referring to FIG. 6B, a thermal oxidation process, a low pressure chemical vapor deposition process, or the like is performed selectively to form an oxide film 72a for a storage dielectric film on an entire surface of the first conductive type semiconductor substrate 60 inclusive of the trench T1, with a thickness in a range of about 100 Å to about 1000 Å.

Figure 6C:
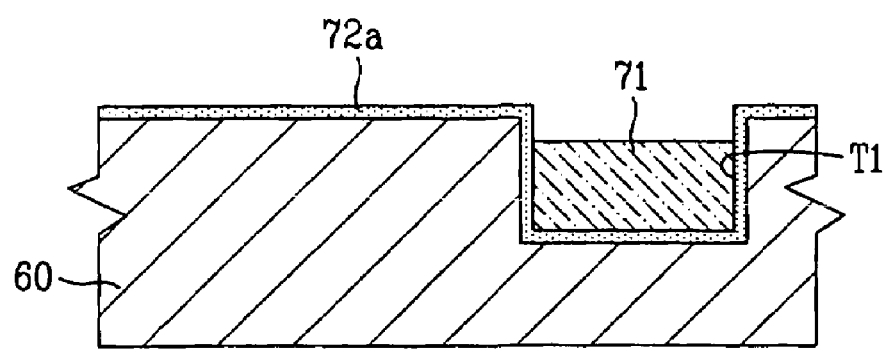

Referring to FIG. 6C, after a polysilicon film is formed on the oxide layer 72a inclusive of the inside of the trench T1, the polysilicon layer is subjected to chemical mechanical polishing and etch back selectively. A first storage electrode 71 is formed in the trench T1.

Figure 6D:
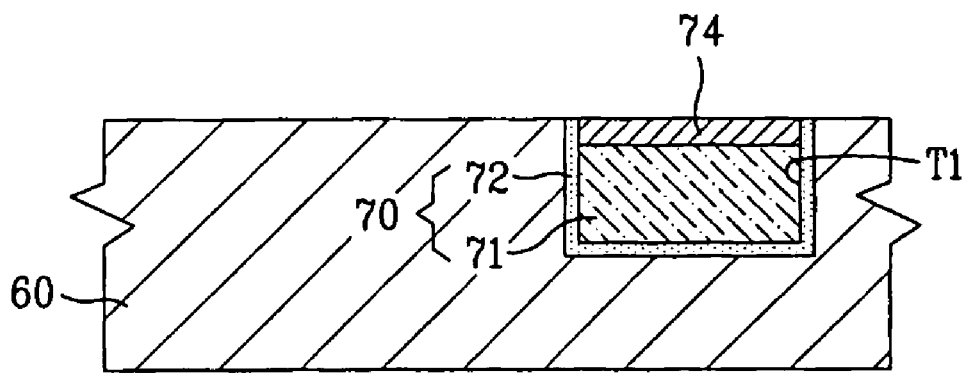

Referring to FIG. 6D, a nitride film is formed on the oxide film 72a inclusive of the first storage electrode 71. The nitride film and the oxide film 72a are polished by a chemical mechanical polishing process until substantially flush with a surface of the first conductive type semiconductor substrate 60. This forms a protective film 74 which fills a remained space of the trench T1 while covering a surface of the first storage electrode 71 and a storage dielectric film 72. A capacitor 70 is thus formed. The protective film 74 protects the first storage electrode 71 from following process environments.

Figure 6E:
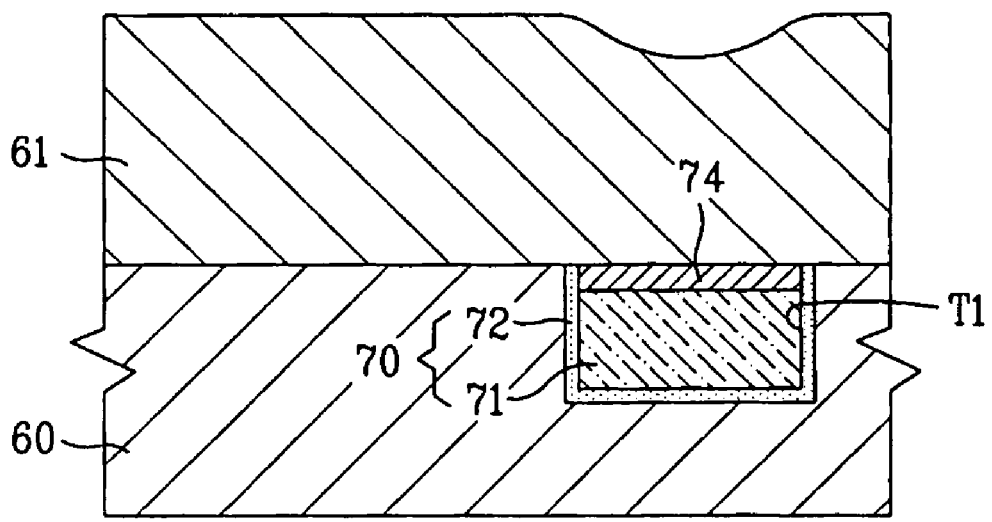

Referring to FIG. 6E, on the first conductive type semiconductor substrate 60 inclusive of the capacitor 70 and the protective film 74, either a second conductive type epitaxial layer 61 is formed by an epitaxial process, or a second conductive type silicon layer is deposited. For convenience of description, it is assumed that an epitaxial layer 61 is formed.

Figure 6F:
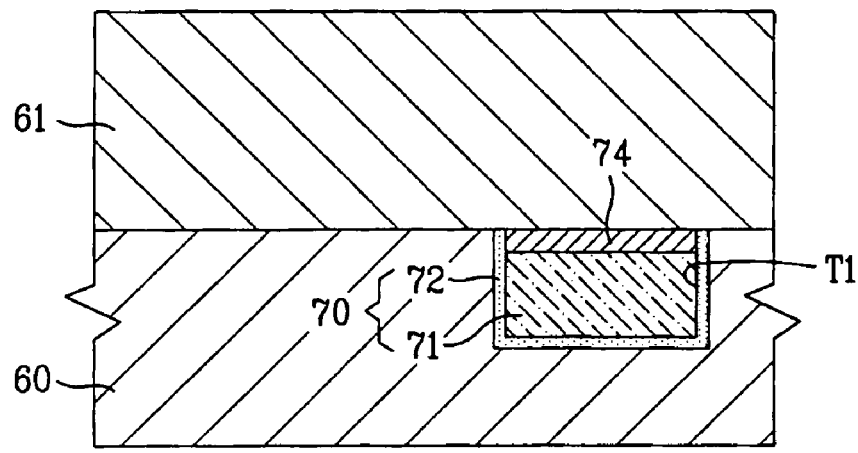

Referring to FIG. 6F, a chemical mechanical polishing process, an etch back process, or the like is performed selectively to smooth the epitaxial layer 61. The epitaxial layer 61 is formed to have a thickness in a range of about 3000 Å to about 8000 Å, so that a transistor formed in a following process is satisfactorily operative.

Figure 6G:
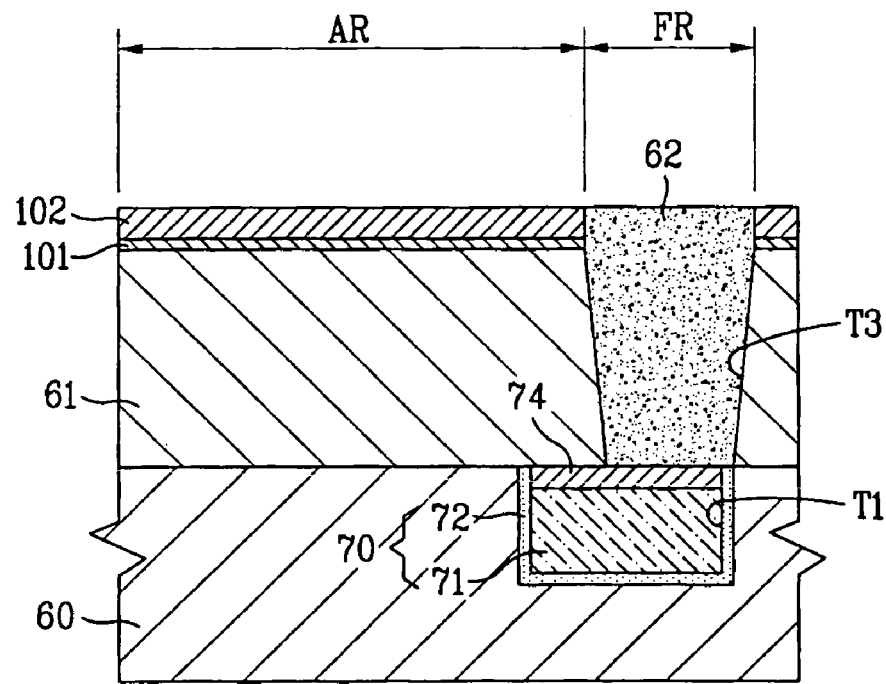

Referring to FIG. 6G a high temperature thermal oxidation process and a low pressure vapor deposition process are performed to form a sacrificial oxide film 101 and a sacrificial nitride film 102 on the second conductive type epitaxial layer. Then, the sacrificial oxide film 101 and the sacrificial nitride film 102 are removed selectively to expose the second conductive type epitaxial layer 61 in the field region FR.

A reactive ion etching process is performed by using the patterned sacrificial oxide film 10, and the patterned sacrificial nitride film 102 as a mask. The exposed second conductive type epitaxial layer 61 is etched in the field region FR anisotropically to a depth in a range of about 6000 Å to about 12000 Å to form an active cell isolation trench T3. The active cell isolation trench T3 is in the second conductive type epitaxial layer 61, and is in contact with the protective film 74 in the trench T1.

An ozone-TEOS (Tetra Ortho Silicate Glass) process, an atmospheric chemical vapor deposition process, a plasma chemical vapor deposition process, a high density plasma chemical vapor deposition process (HDP CVD process), or similar process is performed to form an insulating film (oxide film) of an adequate thickness on the second conductive type epitaxial layer 61 inclusive of the active cell isolation trench T3 to fill the trench T3. A chemical mechanical polishing process is performed by using the sacrificial nitride film 102 as an etch stop layer to smooth the insulating film, and to form an active cell isolation film 62 which fills a space of the active cell isolation trench T3. Then, the sacrificial nitride film 102 and the sacrificial oxide film 101 are removed.

Though it is shown in the drawings that only one active cell isolation film 62 is formed in the second conductive type epitaxial layer 61, it is apparent that the active cell isolation film 62 is actually formed in many places of the second conductive type epitaxial layer 61 for fabricating the semiconductor device.

Figure 6H:
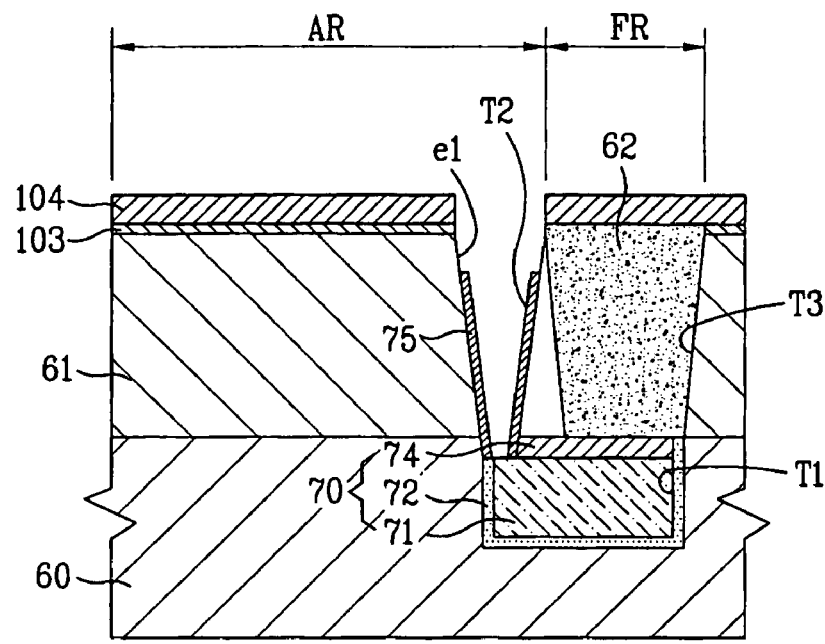

Referring to FIG. 6H, a high temperature thermal oxidation process, a low pressure chemical vapor deposition process, and the like are performed to form a sacrificial oxide film 103 and a sacrificial nitride film 104 on the second conductive type epitaxial layer 61. The sacrificial oxide film 103 and the sacrificial nitride film 104 are again patterned until a portion of the second conductive type epitaxial layer 61 is exposed in the active region AR.

A reactive ion etching process is performed by using the patterned sacrificial oxide film 103 and the patterned sacrificial nitride film 104 as a mask. The exposed second conductive type epitaxial layer 61 is etched in the active region FR adjacent to the active cell isolation film 62 and a portion of the protective film 74 to form an open trench T2 which exposes the first storage electrode 71. The open trench T2 serves as an electric passage between the first storage electrode 71 and the transistor.

Then, an insulating film 75 is formed on an inside surface of the open trench T2 by thermal oxidation. The insulating film 75 is selectively removed from an upper surface of the first storage electrode 71 and an upper surface of the open trench T2 by anisotropic etching.

Figure 6I:
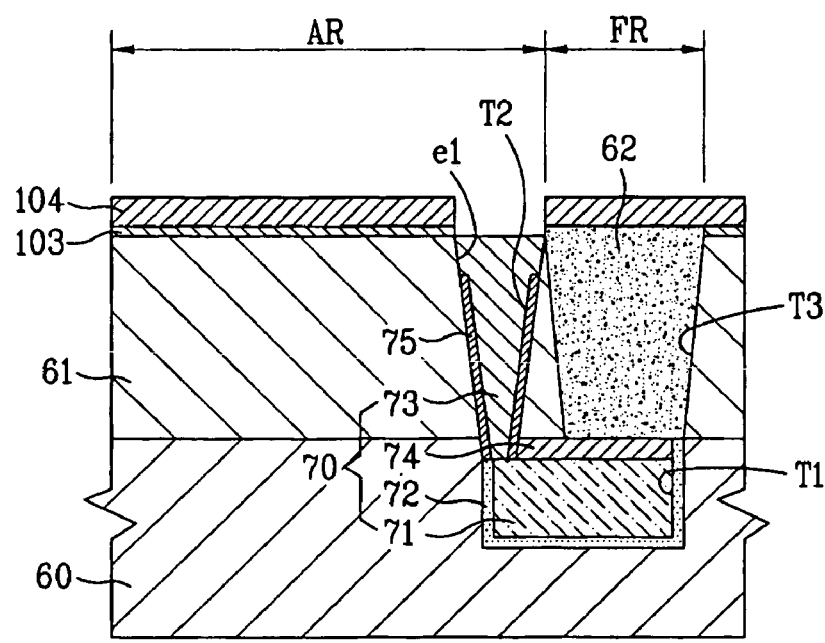

Referring to FIG. 6I, a polysilicon layer is deposited to substantially fill the open trench T2. The polysilicon layer is smoothed by chemical mechanical polishing by using the sacrificial nitride film 104 as an etch stop layer. Then, the smoothed polysilicon layer is etched down to a height of a surface of the second conductive type epitaxial layer 61 to form the second storage electrode 73 in the open trench T2 connected to the first storage electrode 71. The second storage electrode 73 electrically connects source/drain diffusion layers of a transistor 80 to be formed layer and the first storage electrode 71.

Figure 6J:
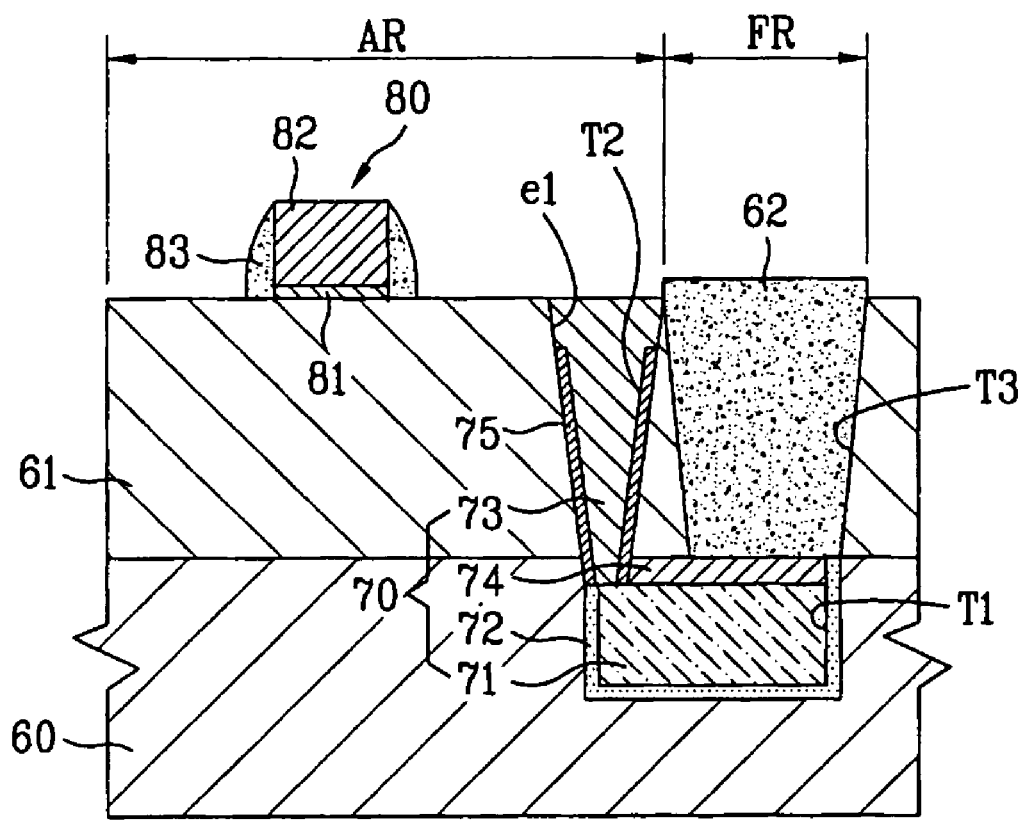

Referring to FIG. 6J, the sacrificial nitride film 104 and the sacrificial oxide film 103 are removed. A gate insulating film is formed on the second conductive type epitaxial layer 61 by thermal oxidation. A conductive layer for a gate electrode is formed on the gate insulating film by chemical vapor deposition. Then, the gate insulating film and the conductive layer are patterned to form a gate insulating film pattern 81 and a gate electrode pattern 82.

Then, similar to the first embodiment, spacers 83 are formed on sidewalls of the gate electrode pattern 82. First conductive type (for an example, a n type) impurity ions are injected into the second conductive type epitaxial layer 61 on opposite sides of the gate electrode pattern 82 by using the gate electrode pattern 82 and the spacers 83 as a mask to form source/drain diffusion layers 84.

Figure 6K:
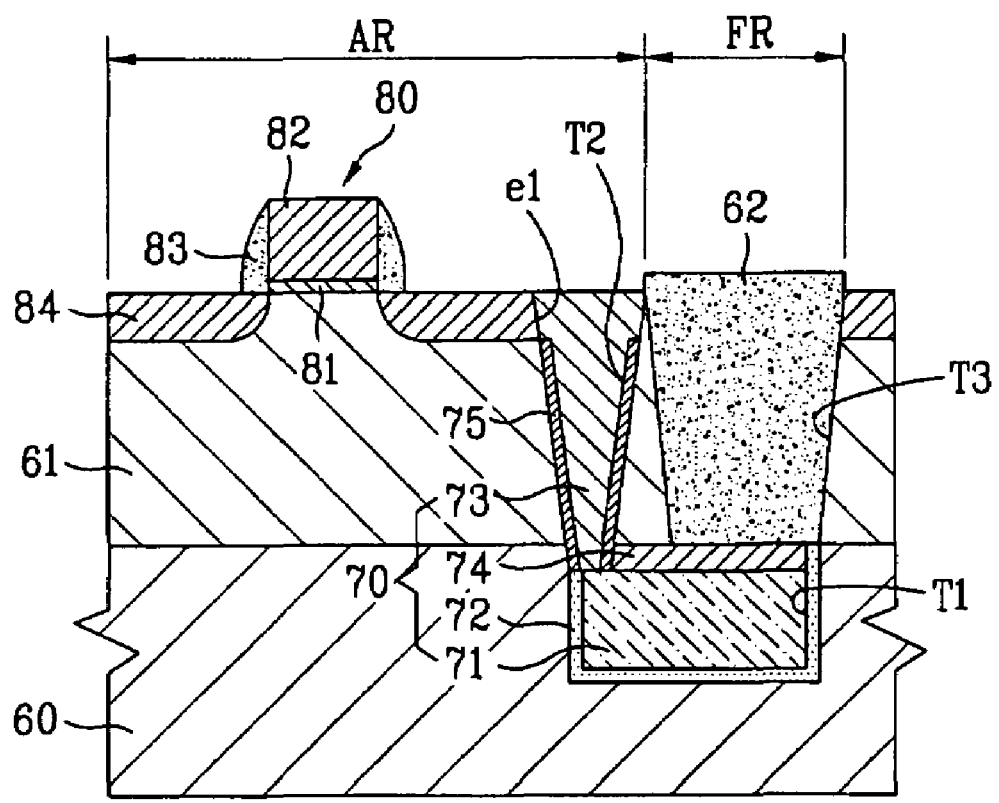

Referring to FIG. 6K, the source/drain diffusion layer 84 is electrically connected to the first storage electrode 71 of the capacitor 70 through the second storage electrode 73 in the open trench T2. According to this, the capacitor 70, formed in the field region, can store charges switched by the transistor 80.

Thereafter, for an example, an interlayer insulating film forming process, a contact hole forming process, a metal wiring process, and so on are performed, additionally, to complete fabrication of a semiconductor device.

As has been described, the semiconductor device and the method for fabricating the same have the following advantages.

First, formation of the capacitor under the active cell isolation film permits fabrication of a high density device package.

Second, the capacitor which has a storage dielectric film and a storage electrode formed in the trench, and uses the semiconductor substrate as a plate electrode, allows reduction of a step height lower than a stacking type in which the capacitor is stacked on the semiconductor substrate.

Korean Patent Application Nos. P2003-0100708, and P2003-0100955, both filed on Dec. 30, 2003, are each hereby incorporated by reference herein in their entirety.

It will be apparent to those skilled in the art that various modifications and variations can be made in the present invention without departing from the spirit or scope of the inventions. Thus, it is intended that the present invention covers the modifications and variations of this invention within the scope of the appended claims and their equivalents.

What is claimed is:

1. A semiconductor device comprising:
    a first conductive type semiconductor substrate having an active region and a field region defined thereon, and a trench formed in the field region;
    a storage dielectric film on an inside surface of the trench;
    a first storage electrode of a capacitor in the trench having the dielectric film formed therein;
    a protective film on the first storage electrode;
    a second conductive type epitaxial layer on an entire surface of the first conductive type semiconductor substrate;
    an active cell isolation film in the field region of the second conductive type epitaxial layer;
    a transistor on the second conductive type epitaxial layer in the active region, the transistor having a source and/or drain region;
    an open trench formed by selectively removing the second conductive type epitaxial layer adjacent to the active cell isolation film and the protective film; and
    a second storage electrode in the open trench configured to connect the source and/or drain region of the transistor and the first storage electrode.

2. The semiconductor device as claimed in claim 1, wherein the second storage electrode is electrically isolated from the semiconductor substrate.

3. The semiconductor device as claimed in claim 1, wherein the storage dielectric film has a thickness ranging from about 100 Å to about 1000 Å.

4. The semiconductor device as claimed in claim 1, wherein the second conductive type epitaxial layer has a thickness ranging from about 3000 Å to about 8000 Å.

5. A method for fabricating a semiconductor device, comprising the steps of:

forming a trench in a field region of a first conductive type semiconductor substrate, the first conductive type semiconductor substrate having an active region and the field region defined thereon;

forming a storage dielectric film on an inside surface of the trench;

forming a first storage electrode in the trench;

forming a protective film on the first storage electrode;

forming a second conductive type epitaxial layer on an entire surface of the first conductive type semiconductor substrate;

forming an active cell isolation trench in the second conductive type epitaxial layer in the field region;

forming an active cell isolation film in the active cell isolation trench;

forming an open trench in the second conductive type epitaxial layer adjacent to the active cell isolation film to expose the first storage electrode;

forming a second storage electrode in the open trench, the second storage electrode connected to the first storage electrode; and forming a transistor on the second conductive type epitaxial layer in the active region such that a source and/or drain region is connected to the second storage electrode.

6. The method as claimed in claim 5, wherein the step of forming a storage dielectric film includes forming the storage dielectric film of an oxide film.

7. The method as claimed in claim 5, wherein the step of forming a storage dielectric film includes forming the storage dielectric film with a thickness ranging from about 100 Å to about 1000 Å.

8. The method as claimed in claim 5, wherein the step of forming a second conductive type epitaxial layer includes forming the second conductive type epitaxial layer with a thickness ranging from about 3000 Å to about 8000 Å.

9. The method as claimed in claim 5, wherein the step of forming a second conductive type epitaxial layer includes forming the second conductive type epitaxial by depositing a single crystal silicon layer.

* * * * *